(12) United States Patent
Chu et al.

(10) Patent No.: US 9,337,332 B2
(45) Date of Patent: May 10, 2016

(54) III-NITRIDE INSULATING-GATE TRANSISTORS WITH PASSIVATION

(71) Applicant: HRL Laboratories LLC., Malibu, CA (US)

(72) Inventors: Rongming Chu, Agoura Hills, CA (US); Mary Y. Chen, Beverly Hills, CA (US); Xu Chen, Los Angeles, CA (US); Zijian "Ray" Li, Oak Park, CA (US); Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/290,029

(22) Filed: May 29, 2014

(65) Prior Publication Data
US 2015/0349117 A1    Dec. 3, 2015

(51) Int. Cl.
| | |
|---|---|
| *H01L 29/778* | (2006.01) |
| *H01L 29/78* | (2006.01) |
| *H01L 29/66* | (2006.01) |
| *H01L 29/423* | (2006.01) |
| *H01L 29/51* | (2006.01) |
| *H01L 29/20* | (2006.01) |

(52) U.S. Cl.
CPC ...... *H01L 29/7827* (2013.01); *H01L 29/66462* (2013.01); *H01L 29/66522* (2013.01); *H01L 29/66666* (2013.01); *H01L 29/7783* (2013.01); *H01L 29/7786* (2013.01); *H01L 29/2003* (2013.01); *H01L 29/4236* (2013.01); *H01L 29/42376* (2013.01); *H01L 29/513* (2013.01)

(58) Field of Classification Search
CPC .......... H01L 29/66446; H01L 29/66462; H01L 29/66469; H01L 29/66522; H01L 29/778; H01L 29/7783; H01L 29/7786
See application file for complete search history.

(56) References Cited

U.S. PATENT DOCUMENTS

| | | | |
|---|---|---|---|
| 6,423,645 B1 | 7/2002 | Wei et al. | |
| 7,304,331 B2 | 12/2007 | Saito et al. | |

(Continued)

FOREIGN PATENT DOCUMENTS

| | | |
|---|---|---|
| JP | 2008-227501 | 9/2008 |
| JP | 2012-156164 | 8/2012 |
| WO | 2007/062589 | 6/2007 |

OTHER PUBLICATIONS

International Search Report and Written Opinion from PCT/US2014/055881 mailed Dec. 22, 2014.

(Continued)

*Primary Examiner* — Bryan Junge
(74) *Attorney, Agent, or Firm* — Ladas & Parry

(57) ABSTRACT

A field-effect transistor (FET) includes a plurality of semiconductor layers, a source electrode and a drain electrode contacting one of the semiconductor layers, a first dielectric layer on a portion of a top semiconductor surface between the source and drain electrodes, a first trench extending through the first dielectric layer and having a bottom located on a top surface or within one of the semiconductor layers, a second dielectric layer lining the first trench and covering a portion of the first dielectric layer, a third dielectric layer over the semiconductor layers, the first dielectric layer, and the second dielectric layer, a second trench extending through the third dielectric layer and having a bottom located in the first trench on the second dielectric layer and extending over a portion of the second dielectric, and a gate electrode filling the second trench.

30 Claims, 7 Drawing Sheets

(56) References Cited

U.S. PATENT DOCUMENTS

| | | | |
|---|---|---|---|
| 7,555,219 | B2 | 6/2009 | Cox et al. |
| 7,622,763 | B2 | 11/2009 | Suda et al. |
| 8,124,505 | B1 | 2/2012 | Burnham et al. |
| 8,592,868 | B2 | 11/2013 | Heikman et al. |
| 8,853,709 | B2 | 10/2014 | Chu et al. |
| 8,872,233 | B2 | 10/2014 | Lim et al. |
| 8,941,118 | B1 | 1/2015 | Chu et al. |
| 9,024,357 | B2 | 5/2015 | Puglisi et al. |
| 9,059,200 | B1 | 6/2015 | Chu et al. |
| 2003/0020092 | A1 | 1/2003 | Parikh et al. |
| 2005/0056893 | A1 | 3/2005 | Hadizad |
| 2006/0060871 | A1 | 3/2006 | Beach et al. |
| 2006/0194379 | A1 | 8/2006 | Suda et al. |
| 2007/0141823 | A1 | 6/2007 | Preble et al. |
| 2007/0210332 | A1 | 9/2007 | Ueno et al. |
| 2008/0121895 | A1* | 5/2008 | Sheppard et al. ............... 257/76 |
| 2008/0237605 | A1 | 10/2008 | Murata et al. |
| 2008/0261378 | A1 | 10/2008 | Yao et al. |
| 2009/0146186 | A1 | 6/2009 | Kub et al. |
| 2009/0315078 | A1 | 12/2009 | Parikh et al. |
| 2010/0025730 | A1 | 2/2010 | Heikman et al. |
| 2010/0090251 | A1 | 4/2010 | Lorenz et al. |
| 2010/0155780 | A1 | 6/2010 | Machida et al. |
| 2011/0049526 | A1* | 3/2011 | Chu .................. H01L 21/28587 257/76 |
| 2012/0235160 | A1 | 9/2012 | Heikman et al. |
| 2012/0261720 | A1 | 10/2012 | Puglisi et al. |
| 2013/0001646 | A1 | 1/2013 | Corrion et al. |
| 2013/0026495 | A1 | 1/2013 | Chu et al. |
| 2013/0092947 | A1* | 4/2013 | Green ............... H01L 21/28264 257/76 |
| 2013/0181224 | A1 | 7/2013 | Lim et al. |
| 2013/0306978 | A1* | 11/2013 | Chen ................. H01L 21/02381 257/76 |
| 2013/0313609 | A1* | 11/2013 | Akutsu et al. .................. 257/192 |
| 2014/0092396 | A1 | 4/2014 | Hopp |
| 2014/0159050 | A1* | 6/2014 | Yoon et al. ....................... 257/76 |
| 2014/0191288 | A1* | 7/2014 | Kotani et al. .................. 257/194 |
| 2015/0048419 | A1* | 2/2015 | Okamoto ............ H01L 29/7827 257/192 |
| 2015/0060946 | A1* | 3/2015 | Makiyama .................... 257/194 |

OTHER PUBLICATIONS

ISR/WO for related PCT/US2013/062750 mailed on Jun. 26, 2014.
U.S. Appl. No. 14/838,958, filed Aug. 28, 2015, Chu et al.
Ambacher, O. et al., "Two-Dimensional Electron Gases Induced by Spontaneous and Piezoelectric Polarization Charges in N- and Ga-face AlGaN/GaN Heterostructures," *Journal of Applied Physics*, vol. 85, No. 6, pp. 3222-3233, (Mar. 15, 1999).
Burnham, Shawn D. et al., "Gate-Recessed Normally-Off GaN-on-Si HEMT Using a New O2-BCl3 Digital Etching Technique," *Physica Status Solidi C7, (ICNS-8)*, vol. 7, No. 7-8, pp. 2010-2012, (2010).
Buttari D. et al., "Digital Etching for Highly Reproducible Low Damage Gate Recessing on AlGaN/GaN HEMTs," *Proceedings, IEEE Lester Eastman Conference, High Performance Devices*, pp. 461-469, (Aug. 6-8, 2002).
Buttari D. et al., "Origin of Etch Delay Time in C12 Dry Etching of AlGaN/GaN Structures," *Applied Physics Letters*, vol. 83, No. 23, pp. 4779-4781, (Dec. 8, 2003).
Buttari D. et al., "Selective Dry Etching of GaN Over AlGaN in BCL3/SF6 Mixtures," *Proceedings, IEEE Lester Eastman Conference, High Performance Devices*, vol. 14, No. 3, pp. 132-137, (Aug. 2004).
Cai, Yong et al., "High-Performance Enhancement-Mode AlGaN/GaN HEMTs Using Fluoride-Based Plasma Treatment," *IEEE Electron Device Letters*, vol. 26, No. 7, pp. 435-437, (Jul. 2005).
Chen, T. et al., "AlGaN/GaN MIS HEMT with ALD Dielectric," *Digest of CS MANTECH Conference*, pp. 227-230, (Apr. 24-27, 2006).
DeSalvo, Gregory C. et al., "Wet Chemical Digital Etching of GaAs at Room Temperature," *Journal of The Electrochemical Society*, vol. 143, No. 11, pp. 3652-3656, (Nov. 1996).
Hahn et al., "P-Channel Enhancement and Depletion Mode GaN-Based HFETs with Quaternary Backbarriers," *IEEE Transaction on Electron Devices*, (2013).
Harris H. et al., "Plasma Enhanced Metalorganic Chemical Vapor Deposition of Amorphous Aluminum Nitrade," *Journal of Applied Physics*, American Institute of Physics, vol. 90, No. 11, pp. 5825-5831, (Dec. 1, 2011).
Hashizume, T. et al., "Capacitance-Voltage Characterization of AlN/GaN Metal-Insulator-Semiconductor Structures Grown on Sapphire Substrate by Metalorganic Chemical Vapor Deposition," *Journal of Applied Physics*, vol. 88, No. 4, pp. 1983-1986, (Aug. 15, 2000).
Keogh, David et al., "Digital Etching of III-N Materials Using a Two-Step Ar/KOH Technique," *Journal of Electronic Materials*, vol. 35, No. 4, pp. 771-776, (2006).
Khan, M. Asif et al., "Enhancement and Depletion Mode GaN/AlGaN Heterostructure Field Effect Transistors," *Applied Physics Letters*, vol. 68, No. 4, pp. 514-516, (Jan. 22, 1996).
Lanford, W. B. et al., "Recessed-gate enhancement-mode GaN HEMT with high threshold voltage," *Electronics Letters*, vol. 41, No. 7, pp. 449-450, (Mar. 31, 2005).
Li G. et al., "Polarization-Induced GaN on Insulator E/D Mode P-Channel Heterostructure FETs," *IEEE Electron Device Letters*, (2013).
Ludviksson, Audunn et al., "Atomic Layer Etching Chemistry of Cl2 on GaAs(100)," *Surface Science*, vol. 277, pp. 282-300, (1992).
Maher, H. et al., "Smooth Wet Etching by Ultraviolet-Assisted Photoetching and Its Application to the Fabrication of AlGaN/GaN Heterostructure Field-Effect Transistors," *Applied Physics Letters*, vol. 77, No. 23, pp. 3833-3835, (Dec. 4, 2000).
Moon, Jeong S. et al., "Submicron Enhancement-mode AlGaN/GaN HEMTs," *Device Research Conference, 60$^{th}$ DRC. Conference Digest*, pp. 23-24, (2002).
Okamoto Y. et al., "179 W Recessed-Gate AlGaN/GaN Heterojunction FET with Field-Modulating Plate," *Electronics Letters*, vol. 40, No. 10, (May 13, 2004).
Parish, G. et al., "Simple Wet Etching of GaN," *Proceedings of SPIE, Device and Process Technologies for MEMS and Microelectronics II*, vol. 4592, pp. 104-110, (2001).
Shatalov, M. et al., "GaN/AlGaN P-Channel Inverted Heterostructure JFET," *IEEE Electron Device Letters*, (2002).
Zimmermann T. et al., "P-Channel InGaN HFET Structure Based on Polarization Doping," *IEEE Electron Device Letters*, (2004).
EPO Extended Search Report with Search Opinion for European Patent Application No. 12819630.0 mailed on Mar. 6, 2015.
Chapter II International Preliminary Report on Patentability (IPRP) for PCT/US2012/043114 mailed on Jul. 3, 2013.
International Search Report and Written Opinion for PCT/US2012/043114 mailed on Dec. 26, 2012.
Chp. II International Preliminary Report on Patentability (IPRP) for PCT/US2013/062750 mailed on Aug. 25, 2015.
From U.S. Appl. No. 12/909,497 (Now U.S. Pat. No. 8,124,505), Non-Final Rejection mailed on May 31, 2011.
From U.S. Appl. No. 12/909,497 (Now U.S. Pat. No. 8,124,505), additional Non-Final Rejection mailed on May 31, 2011.
From U.S. Appl. No. 12/909,497 (Now U.S. Pat. No. 8,124,505), Notice of Allowance mailed on Oct. 24, 2011.
From U.S. Appl. No. 12/909,497 (Now U.S. Pat. No. 8,124,505), Notice of Allowance mailed on Nov. 10, 2011.
From U.S. Appl. No. 13/456,039 (Now U.S. Pat. No. 8,853,709), Rejection/Election mailed on Mar. 22, 2013.
From U.S. Appl. No. 13/456,039 (Now U.S. Pat. No. 8,853,709), Non-Final Rejection mailed on Apr. 3, 2013.
From U.S. Appl. No. 13/456,039 (Now U.S. Pat. No. 8,853,709), Final Rejection mailed on Jul. 12, 2013.
From U.S. Appl. No. 13/456,039 (Now U.S. Pat. No. 8,853,709), Advisory Action mailed on Sep. 6, 2013.
From U.S. Appl. No. 13/456,039 (Now U.S. Pat. No. 8,853,709), Non-Final Rejection mailed on Apr. 14, 2014.
From U.S. Appl. No. 13/456,039 (Now U.S. Pat. No. 8,853,709), Notice of Allowance mailed on Jun. 6, 2014.
From U.S. Appl. No. 13/456,039 (Now U.S. Pat. No. 8,853,709), Notice of Allowance mailed on Aug. 12, 2014.

(56) References Cited

OTHER PUBLICATIONS

From U.S. Appl. No. 14/041,667 (Now U.S. Pat. No. 8,941,118), Notice of Allowance mailed on Sep. 19, 2014.
From U.S. Appl. No. 14/469,187 (Now U.S. Pat. No. 9,059,200), Non-Final Rejection mailed on Nov. 25, 2014.
From U.S. Appl. No. 14/469,187 (Now U.S. Pat. No. 9,059,200), Notice of Allowance mailed on Feb. 13, 2015.
From U.S. Appl. No. 14/469,187 (Now U.S. Pat. No. 9,059,200), Notice of Allowance mailed on May 11, 2015.
From U.S. Appl. No. 14/838,958 (Unpublished, Non Publication Requested, filed Aug. 28, 2015), Application and Office Actions.

* cited by examiner

III-NITRIDE INSULATING-GATE TRANSISTORS WITH PASSIVATION

STATEMENT REGARDING FEDERAL FUNDING

This invention was made under U.S. Government contract DE-AR-0000117. The U.S. Government has certain rights in this invention.

CROSS REFERENCE TO RELATED APPLICATIONS

This application is related to U.S. patent application Ser. No. 13/456,039, filed Apr. 25, 2012 and U.S. patent application Ser. No. 14/041,667, filed Sep. 30, 2013, which are incorporated herein as though set forth in full.

TECHNICAL FIELD

This disclosure relates to III-Nitride field effect transistors (FETs) and in particular to insulated gates for FETs.

BACKGROUND

III-nitride transistors are promising for high-speed and high-power applications, such as power switches, which may be used for motor drivers and power supplies, among other applications.

Many of these applications require the transistor to operate in normally-off mode. Normally-off mode operation can be realized by a number of approaches, but typically at the penalty of higher on-resistance and lower output-current.

U.S. patent application Ser. No. 13/456,039, filed Apr. 25, 2012 describes a normally-off III-Nitride field-effect transistor and a method for making a normally-off FET.

U.S. patent application Ser. No. 14/041,667, filed Sep. 30, 2013 describes normally-off III-nitride transistors with high threshold-voltage and low on-resistance.

High-power applications with normally-off III-nitride transistors need an insulated gate to achieve low leakage current, and an effective passivation dielectric to achieve minimal trapping effects.

The best-suited gate insulator and the best-suited passivation dielectric are usually different materials, which may cause processing compatibility problems. For example, plasma-enhanced chemical vapor deposition (PECVD) SiN film is a known good passivation material, while metal organic chemical vapor deposition (MOCVD) AlN is a known good gate insulator material.

Unfortunately, the process of forming MOCVD AlN can degrade a PECVD SiN film that is already deposited on the semiconductor.

What is needed is a device structure and method of making the device that resolves this process incompatibility and that has a high breakdown voltage and low on resistance. The embodiments of the present disclosure answer these and other needs.

SUMMARY

In a first embodiment disclosed herein, a field-effect transistor (FET) comprises a plurality of semiconductor layers, a source electrode contacting at least one of the semiconductor layers, a drain electrode contacting at least one of the semiconductor layers, a first dielectric layer covering a portion of semiconductor top surface between the source electrode and the drain electrode, a first trench extending through the first dielectric layer and having a bottom located on a top surface of the semiconductor layers or within one of the semiconductor layers, a second dielectric layer lining the first trench and covering a portion of the first dielectric layer, a third dielectric layer over the semiconductor layers, the first dielectric layer, and the second dielectric layer, a second trench extending through the third dielectric layer and having a bottom located in the first trench on the surface of or within the second dielectric layer, and extending over a portion of the second dielectric on the first dielectric, and a gate electrode filling the second trench.

In another embodiment disclosed herein, a method of fabricating a field-effect transistor (FET) comprises forming a plurality of semiconductor layers, forming a source electrode contacting at least one of the semiconductor layers, forming a drain electrode contacting at least one of the semiconductor layers, forming a first dielectric layer covering a portion of semiconductor top surface between the source electrode and the drain electrode, forming a first trench extending through the first dielectric layer and having a bottom located on a top surface of the semiconductor layers or within one of the semiconductor layers, forming a second dielectric layer lining the first trench and covering a portion of the first dielectric layer, forming a third dielectric layer over the semiconductor layers, the first dielectric layer, and the second dielectric layer, forming a second trench extending through the third dielectric layer and having a bottom located in the first trench on the surface of or within the second dielectric layer, and extending over a portion of the second dielectric on the first dielectric, and forming a gate electrode filling the second trench.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
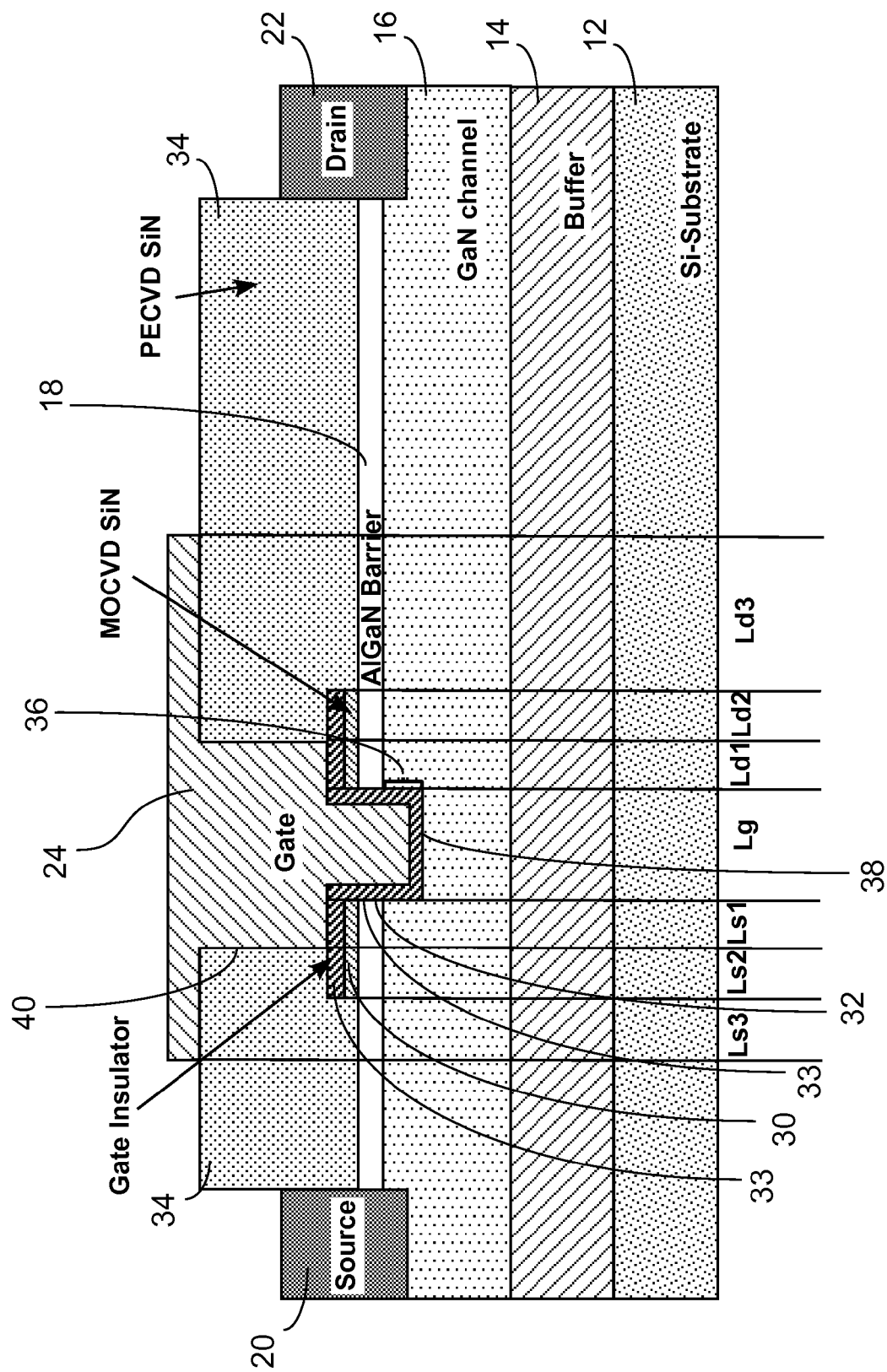
FIG. 1 shows a diagram of III-nitride field effect transistor in accordance with the present disclosure.

FIG. 1 shows a diagram of III-nitride field effect transistor (FET) in accordance with the present disclosure. The FET has a buffer layer 14 formed on a substrate 12. A channel layer 16 is formed on the buffer layer 14 and a barrier layer 18, is formed on the channel layer 16.

The substrate 12 material may be silicon (Si), silicon carbide (SiC), sapphire ($Al_2O_3$), gallium nitride (GaN), or aluminum nitride (AlN).

The buffer layer 14 may be a stack of III-Nitride materials grown on the substrate 12 by chemical vapor deposition or molecular beam epitaxy.

The channel layer 16 may be a III-Nitride material, such as GaN, grown on the buffer layer 14 by chemical vapor deposition or molecular beam epitaxy. Typically the channel layer 16 is an undoped GaN layer with the thickness ranging from 5 nanometers to a few micrometers.

The barrier layer 18 may be 1-30 nanometers thick and may typically be only 5 nm thick. The barrier layer 18 may be AlGaN, with a 25% Al composition.

A source electrode 20 and a drain electrode 22 are in contact with the channel layer 16 and extend through the the barrier layer 18. The source electrode 20 and drain electrode 22 are on opposite ends of the channel layer 16.

A dielectric layer 30, which may be 1 nm to 100 nm thick and is typically 10 nm thick, and which may be SiN, is deposited by metal organic chemical vapor deposition (MOCVD) on top of the AlGaN barrier layer 18. In a preferred embodiment the dielectric layer 30 is deposited by MOCVD at a temperature higher than 600 degrees C., and typically at 900 degrees C.

The dielectric layer 30 is patterned to be on top of the AlGaN barrier layer 18 in a gate area for a distance of Ls2, Ls1, Lg, Ld1 and Ld2, as shown in FIG. 1, between the source 20 and drain 22. In the embodiment of FIG. 1, the dielectric layer 30 is not in contact with either the source 20 or the drain 22.

A first gate trench 32 with a length of Lg, as shown in FIG. 1, is formed through the dielectric layer 30 and the barrier layer 18. The bottom 38 of the gate trench 32 is located within the channel layer 16, and extends below the barrier layer 18 and into the channel layer 16 by a vertical distance 36. This vertical distance 36 is between an interface of the barrier layer 18 and channel layer 16 and the bottom 38 of the gate trench 32, and is typically between 0 and 10 nanometers (nm). The vertical distance 36 needs to be equal or greater than 0 nm for normally-off operation, and needs to be as small as possible to in order to minimize the on-resistance.

Figure 7:
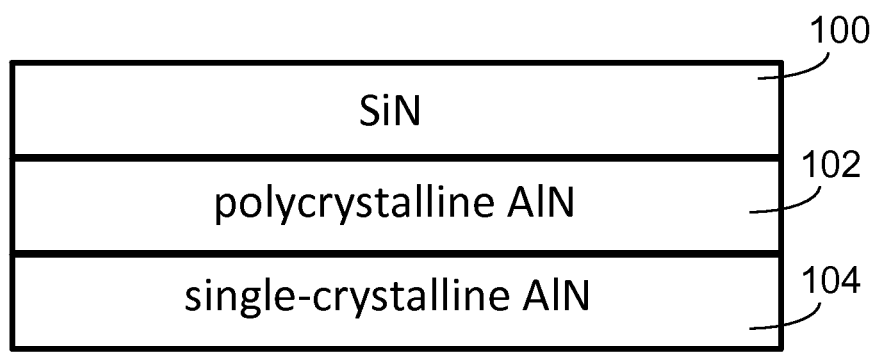
FIG. 7 shows a diagram of a gate insulator stack in accordance with the present disclosure.

A gate insulator 33 is formed in the gate trench 32 and over the dielectric layer 30. As shown in FIG. 7, the gate insulator 33 may include a stack of: a layer of single-crystalline AlN 104 at the bottom of the gate trench 32, which may be up to 2 nm thick and typically 1 nm thick; a layer of polycrystalline AlN 102 on the single crystalline AlN layer, which is 1 nm to 50 nm thick and typically 10 nm thick; and an insulating layer of SiN 100, which may be 1 nm to 50 nm thick and typically 10 nm thick, formed on the polycrystalline AlN layer.

The single crystalline AlN 104 is preferably grown at a temperature greater than 600 C, and less than 1100 C. A preferred temperature for growing the single crystalline AlN 104 is 900 C. The poly crystalline AlN 102 is preferably grown at a temperature greater than 300 C, and less than 900 C, and a preferred temperature is 600 C.

The gate insulator 33 stack makes the FET a normally off FET. Under a positive gate bias the FET has a very low gate leakage, and a high-mobility electron channel is formed at the interface between the barrier layer 18 and the channel layer 16.

The single-crystalline AlN layer 104 of the gate insulator stack 33 provides a high-quality interface for electron transport in the channel layer 16. Furthermore, the single crystalline AlN layer 104 provides an energy barrier to prevent electron trapping into the polycrystalline AlN layer 102. The thickness of the single crystalline AlN layer 104 is chosen to be thin enough, typically below 2 nm, to avoid accumulation of channel electrons in absence of a positive gate bias.

The SiN layer 100 serves as a blocking layer to leakage paths through grain boundaries of the polycrystalline AlN layer 102.

The gate insulator 33 is formed in the trench 32 and over the dielectric layer 30. The gate insulator 33 and the dielectric layer 30 are removed in regions beyond the gate area of Ls2, Ls1, Lg, Ld1 and Ld2, as shown in FIG. 1.

A passivation dielectric 34, which may be SiN and have a thickness of 10 nm to 500 nm with a typical thickness of 100 nm, is deposited by plasma-enhanced chemical vapor deposition (PECVD) over the barrier layer 18 between the source 20 and the drain 22, over the gate insulator 33 in the trench 32, and over the gate insulator 33 on the dielectric layer 30. In a preferred embodiment the passivation dielectric 34 is deposited by PECVD at a temperature lower than 500 degrees C., and typically at 300 degrees C.

A second gate trench 40 is formed in passivation dielectric 34 by etching and may have a length of the sum of Lg, Ls1 and Ld1, as shown in FIG. 1. The second gate trench 40 extends to the gate insulator 33 in the gate trench 32 and overlaps the gate insulator 33 on the dielectric layer 30 by a distance Ls1 and Ld1, as shown in FIG. 1. The gate insulator 33 on the dielectric layer 30 for distance Ls2 and Ld2 on either side of Ls1 and Ld1, as shown in FIG. 1, remains covered by the passivation layer 34.

A gate electrode 24 is formed within the second gate trench 40 and may extend over the passivation layer 34 partially toward the source electrode 20 by a distance Ls3, as shown in FIG. 1, and partially toward the drain electrode 22 by a distance Ld3, as shown in FIG. 1, to form an integrated gate field-plate. The gate electrode 24 may be any suitable metal.

As shown in FIG. 1, two types of dielectric are in contact with the AlGaN barrier layer 18 in the gate to drain region. The two types of dielectric are: a dielectric layer 30, which may be a SiN layer deposited by metal organic chemical vapor deposition (MOCVD), and a passivation dielectric layer 34, which may be a SiN layer deposited by plasma-enhanced chemical vapor deposition (PECVD).

Dielectric layer 30 is deposited prior to the deposition of the gate insulator layer stack 33. The dielectric layer 30 serves as a etch stop layer for the patterning of the gate insulator layer stack 33, and dielectric layer 30 can survive subsequent high-temperature steps, such as the deposition of gate insulator layer stack 33 and the alloying of source 20 and drain 22 contacts.

Dielectric layer 34 serves the purpose of mitigating trapping behaviors. Dielectric layer 34 is deposited after the deposition of gate insulator layer stack 33, to avoid the impact of high-temperature processing on the properties of dielectric layer 34.

Figure 2:
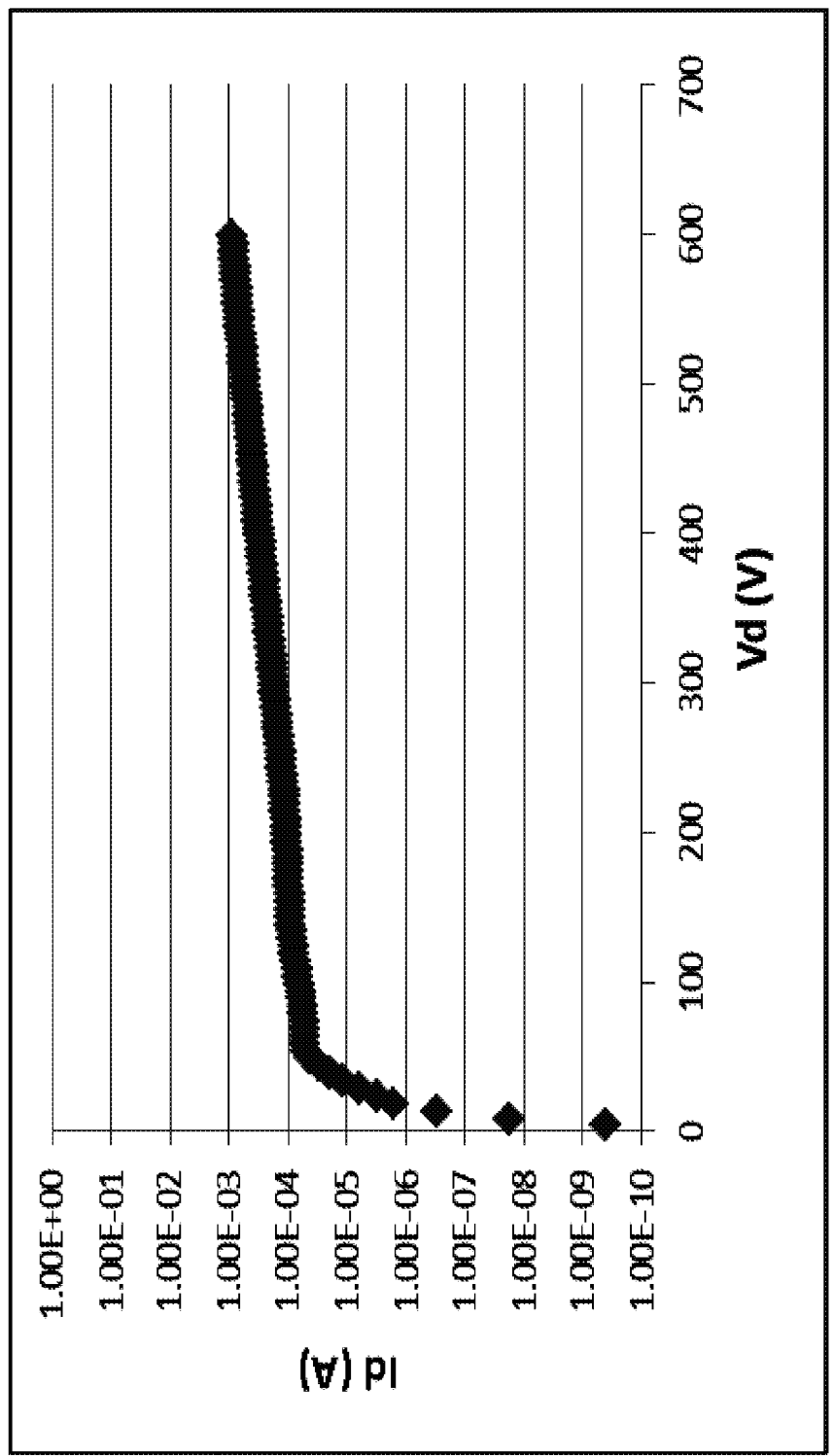
FIG. 2 shows a typical off-state current voltage (IV) characteristic of a FET in accordance with the present disclosure.

FIG. 2 shows a typical off-state current voltage (IV) characteristic of a FET in accordance with the present disclosure. As shown in FIG. 2, the off-state current is very low even at 600 volts, demonstrating the breakdown voltage is greater than 600 volts.

Figure 3:
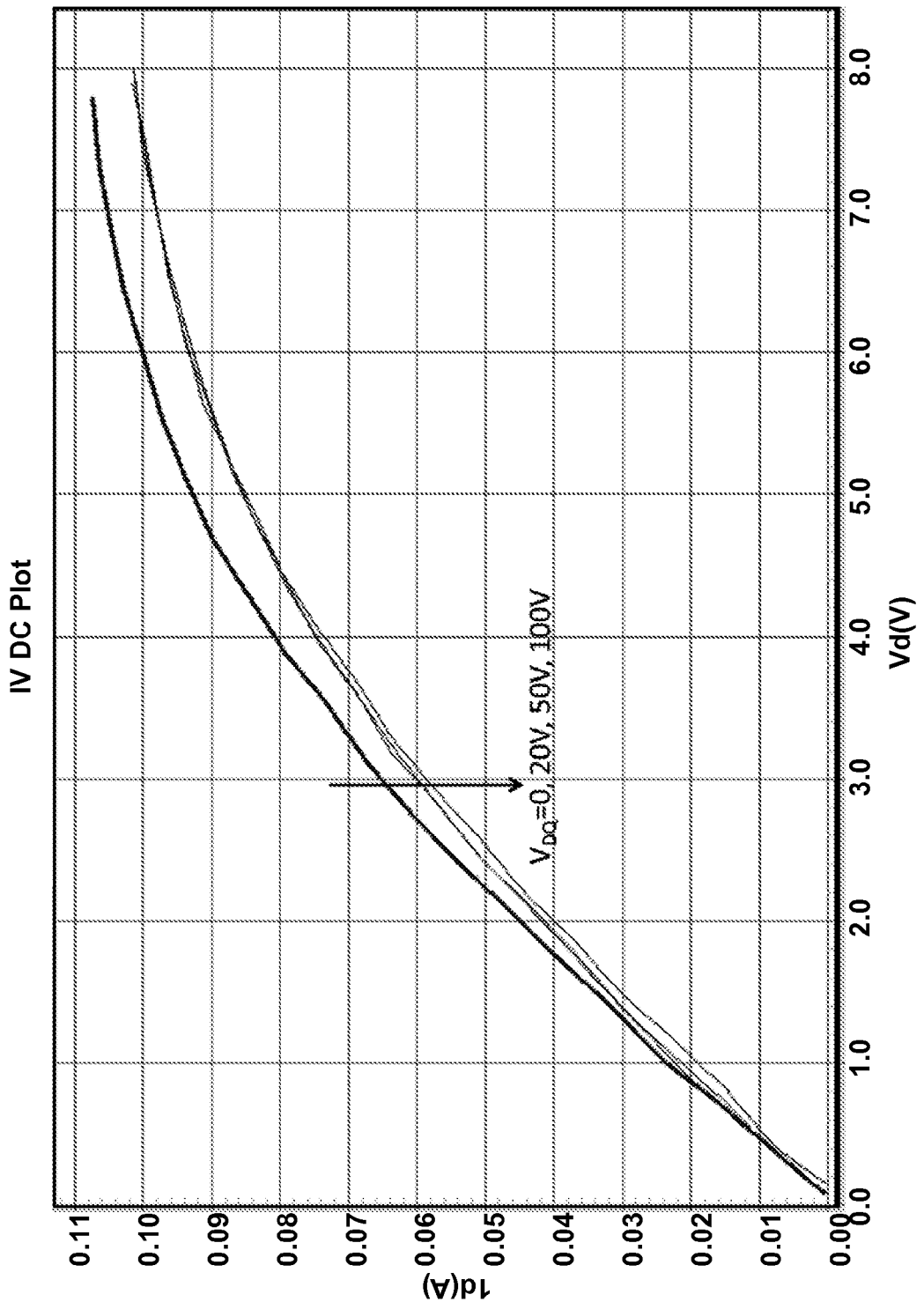
FIG. 3 shows a typical dynamic current voltage (IV) characteristic of a FET in accordance with the present disclosure.

FIG. 3 shows a typical dynamic current voltage (IV) characteristic of a FET in accordance with the present disclosure, and the graph demonstrates that the on-resistance for a FET is only minimally degraded.

Figure 4:
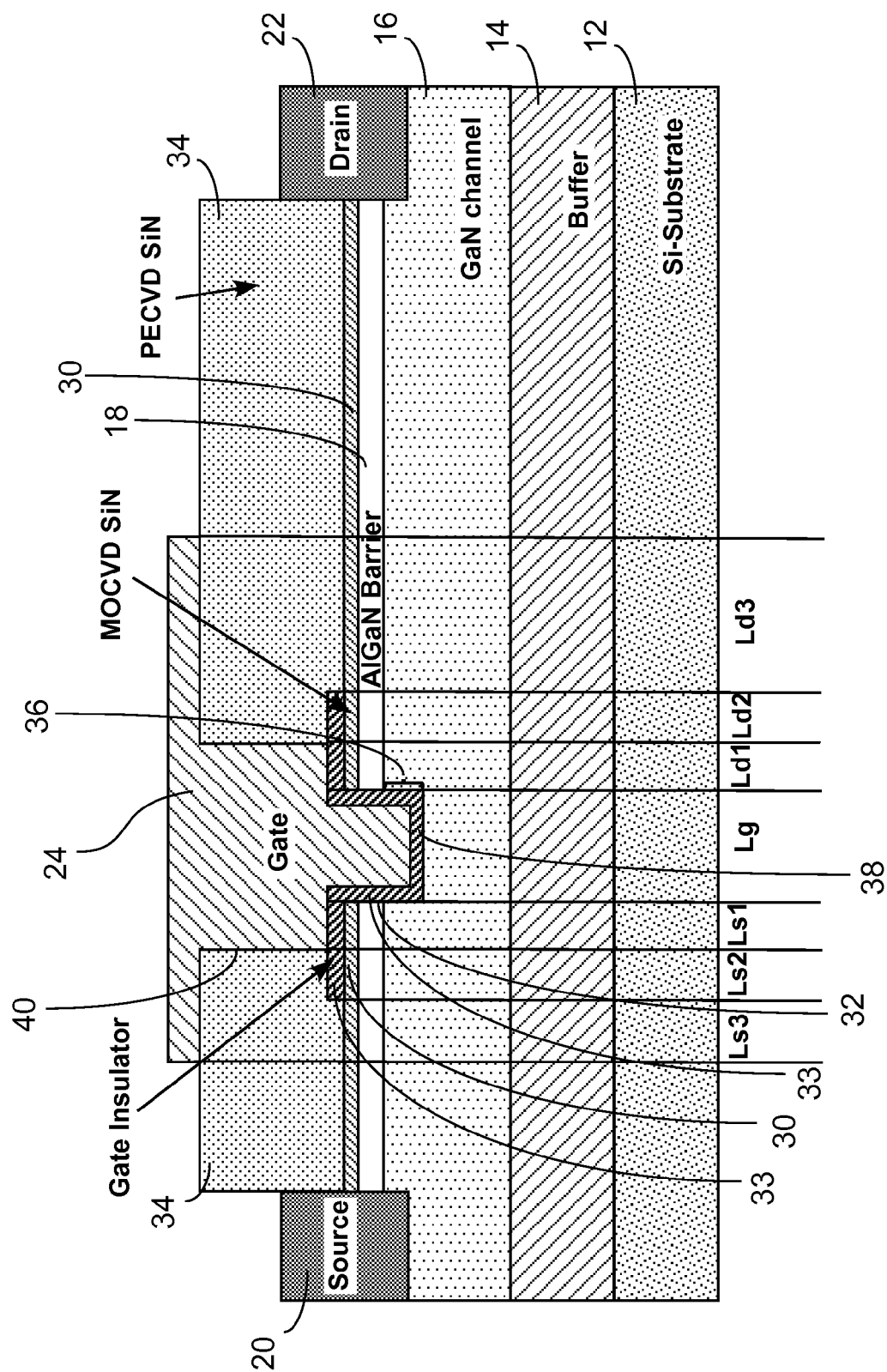
FIG. 4 shows a diagram of another field effect transistor in accordance with the present disclosure.

FIG. 4 shows a diagram of another field effect transistor in accordance with the present disclosure. The embodiment of FIG. 4 is similar to the embodiment of FIG. 1. However, in the embodiment of FIG. 4 the dielectric layer 30, which may be 1 nm to 100 nm thick and is typically 10 nm thick, and which may be SiN, is deposited by metal organic chemical vapor deposition (MOCVD) on top of the AlGaN barrier layer 18 and extends from the source 20 to the drain 22, as shown in FIG. 4, rather than just in the gate area as shown in FIG. 1.

Figure 5:
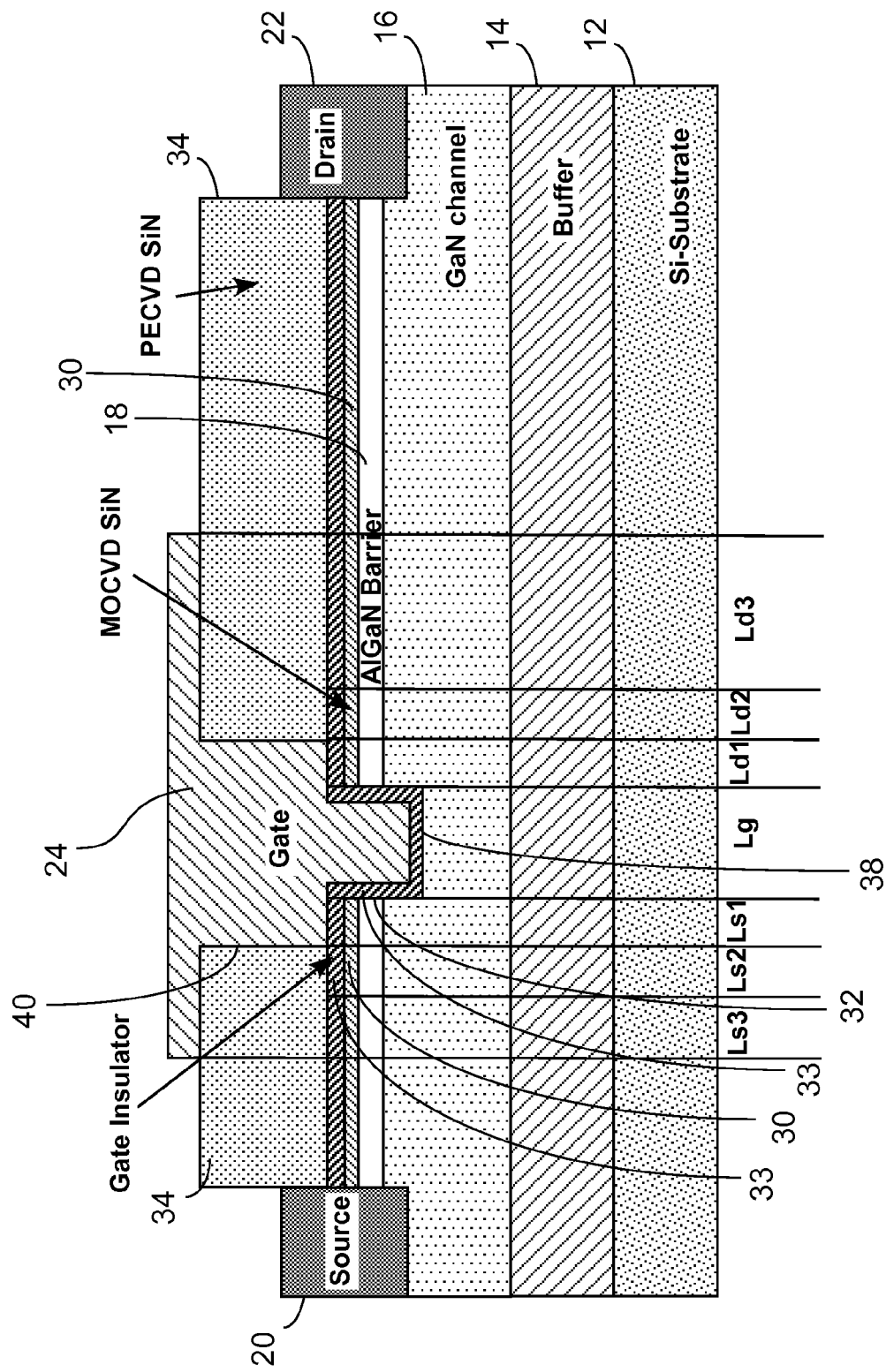
FIG. 5 shows a diagram of yet another field effect transistor in accordance with the present disclosure.

FIG. 5 shows a diagram of yet another field effect transistor in accordance with the present disclosure. The embodiment of FIG. 5 is similar to the embodiment of FIG. 4. However, in the embodiment of FIG. 5 the gate insulator stack 33 extends from the source 20 to the drain 22, as shown in FIG. 5, rather than just in the gate area as shown in FIG. 4.

Figure 6:
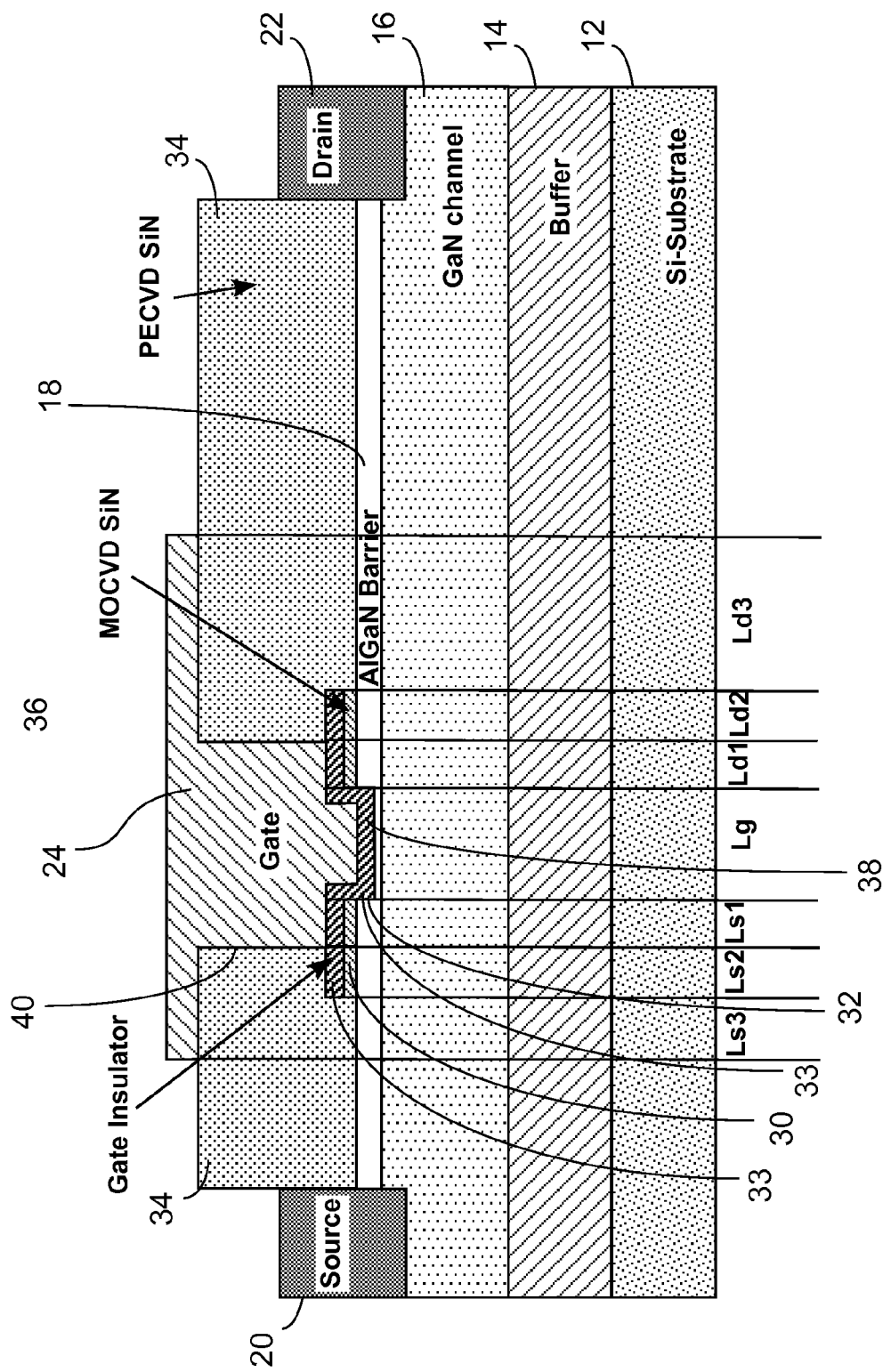
FIG. 6 shows a diagram of still another field effect transistor in accordance with the present disclosure.

FIG. 6 shows a diagram of still another field effect transistor in accordance with the present disclosure. The embodiment of FIG. 6 is similar to the embodiment of FIG. 1. However, in the embodiment of FIG. 6 the bottom 38 of the gate trench 32 is located within the barrier layer 18, and does not extend below the barrier layer 18 into the channel layer 16. The gate trench 32 may also be only to the top surface of the barrier layer 18. Variations of the embodiment of FIG. 6 may also include an embodiment where the dielectric layer 30 extends from the source 20 to the drain 22, and another embodiment where both the dielectric layer 30 and the gate insulator stand extend from the source 20 to the drain 22.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A field-effect transistor (FET) comprising:
a plurality of semiconductor layers;
a source electrode contacting at least one of the semiconductor layers;
a drain electrode contacting at least one of the semiconductor layers;
a first dielectric layer covering a portion of semiconductor top surface between the source electrode and the drain electrode;
a first trench extending through the first dielectric layer and having a bottom located on a top surface of the semiconductor layers or within one of the semiconductor layers;
a second dielectric layer lining the first trench and covering a portion of the first dielectric layer;
a third dielectric layer over the semiconductor layers, the first dielectric layer, and the second dielectric layer;
a second trench extending through the third dielectric layer and having a bottom located in the first trench on the surface of or within the second dielectric layer, and extending over a portion of the second dielectric layer on the first dielectric layer; and
a gate electrode filling the second trench;
wherein the second dielectric layer comprises a single-crystalline AlN layer at the bottom of the first trench; and
wherein the second dielectric layer comprises a polycrystalline AlN layer on the single crystalline AlN layer.

2. The FET of claim 1 further comprising:
a substrate comprising silicon (Si), silicon carbide (SiC), sapphire ($Al_2O_3$), gallium nitride (GaN), or aluminum nitride (AlN);
wherein the plurality of semiconductor layers comprise:
a III-nitride channel layer; and
a barrier layer over the channel layer.

3. The FET of claim 2 wherein:
the channel layer comprises GaN and has a thickness ranging from 5 nanometers to a few micrometers; and
the barrier layer comprises AlGaN having a thickness ranging from 1-30 nanometers and having a 25% Al composition.

4. The FET of claim 2 wherein:
a distance between an interface of the channel layer and the barrier layer and the bottom of the first trench is equal to or greater than 0 nanometers and less than or equal to 10 nanometers.

5. The FET of claim 1 wherein:
the first dielectric layer is deposited by metal organic chemical vapor deposition; and
the third dielectric layer is deposited by plasma-enhanced chemical vapor deposition.

6. The FET of claim 1 wherein:
the first dielectric layer comprises SiN deposited at a temperature greater than 600 degrees centigrade by metal organic chemical vapor deposition; and
the third dielectric layer comprises SiN deposited at a temperature lower than 500 degrees centigrade by plasma-enhanced chemical vapor deposition.

7. The FET of claim 1 wherein:
the gate electrode extends over the third dielectric layer partially toward the source electrode and the drain electrode to form an integrated gate field-plate.

8. The FET of claim 1 wherein:
the first dielectric layer comprises SiN having a thickness of 1 nm to 100 nm; and
the third dielectric layer comprises SiN having a thickness of 10 nm to 500 nm.

9. The FET of claim 1 wherein the second dielectric layer comprises:
a single-crystalline AlN layer at the bottom of the first trench;
a polycrystalline AlN layer on the single crystalline AlN layer; and
an insulating layer comprising SiN on the polycrystalline AlN layer.

10. The FET of claim 9 wherein:
the single crystalline AlN is grown at a temperature greater than 600 C. and less than 1100 C.;
the poly crystalline AlN is grown at a temperature greater than 300 C. and less than 900 C.

11. The FET of claim 9 wherein:
the single crystalline AlN layer is up to 2 nm thick;
the polycrystalline AlN layer is 1 nm to 50 nm thick; and
the insulating layer is 1 nm to 50 nm thick.

12. The FET of claim 1 wherein:
the first dielectric layer is only in a gate area and the second dielectric layer covers the first dielectric layer in the gate area; or
the first dielectric layer extends from the source electrode to the drain electrode and the second dielectric layer covers the first dielectric layer only in the gate area; or
the first dielectric layer extends from the source electrode to the drain electrode and the second dielectric layer covers the first dielectric layer and extends from the source electrode to the drain electrode.

13. The FET of claim 1 wherein:
the single crystalline AlN layer is up to 2 nm thick.

14. The FET of claim 1 wherein:
the single crystalline AlN is grown at a temperature greater than 600 C. and less than 1100 C.

15. A method of fabricating a field-effect transistor (FET) comprising:
forming a plurality of semiconductor layers;
forming a source electrode contacting at least one of the semiconductor layers;
forming a drain electrode contacting at least one of the semiconductor layers;
forming a first dielectric layer covering a portion of semiconductor top surface between the source electrode and the drain electrode;
forming a first trench extending through the first dielectric layer and having a bottom located on a top surface of the semiconductor layers or within one of the semiconductor layers;
forming a second dielectric layer lining the first trench and covering a portion of the first dielectric layer;
forming a third dielectric layer over the semiconductor layers, the first dielectric layer, and the second dielectric layer;
forming a second trench extending through the third dielectric layer and having a bottom located in the first trench on the surface of or within the second dielectric layer, and extending over a portion of the second dielectric layer on the first dielectric layer; and
forming a gate electrode filling the second trench;
wherein the second dielectric layer comprises a single-crystalline AlN layer at the bottom of the first trench; and
wherein the second dielectric layer comprises a polycrystalline AlN layer on the single crystalline AlN layer.

16. The method of claim 15 further comprising:
providing a substrate comprising silicon (Si), silicon carbide (SiC), sapphire ($Al_2O_3$), gallium nitride (GaN), or aluminum nitride (AlN);
wherein the plurality of semiconductor layers comprise:
a III-nitride channel layer; and
a barrier layer over the channel layer.

17. The method of claim 16 wherein:
the channel layer comprises GaN and has a thickness ranging from 5 nanometers to a few micrometers; and
the barrier layer comprises AlGaN having a thickness ranging from 1-30 nanometers and having a 25% Al composition.

18. The method of claim 16 wherein:
a distance between an interface of the channel layer and the barrier layer and the bottom of the first trench is equal to or greater than 0 nanometers and less than or equal to 10 nanometers.

19. The method of claim 15 wherein:
forming the first dielectric layer comprises depositing the first dielectric layer by metal organic chemical vapor deposition; and
forming the third dielectric layer comprises depositing the third dielectric layer by plasma-enhanced chemical vapor deposition.

20. The method of claim 15 wherein:
the first dielectric layer comprises SiN deposited at a temperature greater than 600 degrees centigrade by metal organic chemical vapor deposition; and
the third dielectric layer comprises SiN deposited at a temperature lower than 500 degrees centigrade by plasma-enhanced chemical vapor deposition.

21. The method of claim 15 further comprising:
forming the gate electrode to extend over the third dielectric layer partially toward the source electrode and the drain electrode to form an integrated gate field-plate.

22. The method of claim 15 wherein:
the first dielectric layer comprises SiN having a thickness of 1 nm to 100 nm; and
the third dielectric layer comprises SiN having a thickness of 10 nm to 500 nm.

23. The method of claim 15 wherein the forming the second dielectric layer comprises:
forming a single-crystalline AlN layer at the bottom of the first trench;
forming a polycrystalline AlN layer on the single crystalline AlN layer; and
forming an insulating layer comprising SiN on the polycrystalline AlN layer.

24. The method of claim 23 wherein:
the single crystalline AlN is grown at a temperature greater than 600 C. and less than 1100 C.;
the poly crystalline AlN is grown at a temperature greater than 300 C. and less than 900 C.

25. The method of claim 23 wherein:
the single crystalline AlN layer is up to 2 nm thick;
the polycrystalline AlN layer is 1 nm to 50 nm thick; and
the insulating layer is 1 nm to 50 nm thick.

26. The method of claim 15 wherein:
the first dielectric layer is only formed in a gate area and the second dielectric layer covers the first dielectric layer in the gate area; or
the first dielectric layer is formed to extend from the source electrode to the drain electrode and the second dielectric layer covers the first dielectric layer only in the gate area; or
the first dielectric layer is formed to extend from the source electrode to the drain electrode and the second dielectric layer covers the first dielectric layer and extends from the source electrode to the drain electrode.

27. The method of claim 15 wherein:
the first dielectric layer provides an etch stop for patterning of the second dielectric layer.

28. The method of claim 15 wherein:
forming the first trench comprises etching; and
forming the second trench comprises etching and the second dielectric layer provides an etch stop.

29. The method of claim 15 wherein:
the single crystalline AlN layer is formed up to 2 nm thick.

30. The method of claim 15 wherein:
the single crystalline AlN is grown at a temperature greater than 600 C. and less than 1100 C.

\* \* \* \* \*